United States Patent [19]
Sihn et al.

[11] Patent Number: 6,129,556
[45] Date of Patent: Oct. 10, 2000

[54] COMPUTER SYSTEM USING A CARD HAVING AN EXPANSION EDGE

[75] Inventors: Seong-Kee Sihn; Chang-Hee Lee, both of Suwon, Rep. of Korea

[73] Assignee: SamSung Electronics Co., Ltd., Suwon, Rep. of Korea

[21] Appl. No.: 09/073,859

[22] Filed: May 7, 1998

[30] Foreign Application Priority Data

May 7, 1997 [KR] Rep. of Korea ...................... 97-17486

[51] Int. Cl.⁷ ..................................................... H05K 1/14
[52] U.S. Cl. ............................................. 439/61; 361/785
[58] Field of Search ............................. 439/61; 361/683, 361/785, 788

[56] References Cited

U.S. PATENT DOCUMENTS

| | | | |
|---|---|---|---|
| 4,647,123 | 3/1987 | Chin et al. ................................. | 439/61 |
| 4,979,075 | 12/1990 | Murphy ..................................... | 361/686 |
| 4,996,766 | 3/1991 | Piorunneck et al. ..................... | 439/633 |
| 5,317,483 | 5/1994 | Swindler .................................. | 361/796 |
| 5,403,208 | 4/1995 | Felcman et al. .......................... | 439/633 |
| 5,434,743 | 7/1995 | Hosoya et al. ........................... | 361/686 |
| 5,642,259 | 6/1997 | Ma ............................................ | 361/686 |
| 5,715,146 | 2/1998 | Hoppal ..................................... | 361/683 |

*Primary Examiner*—Neil Abrams
*Attorney, Agent, or Firm*—Robert E. Bushnell, Esq.

[57] ABSTRACT

An expansion card having an expansion edge comprises: a board having an edge supporting a special bus method for controlling input/output of a signal; fixing means for securely attaching the board to system main frame by using screws, the fixing means being provided on an edge of the board and having a plurality of input/output terminals; at least one expansion connector connected to an expansion card via a cable and to the board for transmitting signals to and receiving signals from an expansion card; and an expansion edge additionally formed on an edge of the board, and connected to at least one expansion connector by a wiring pattern, the expansion edge being mated with an expansion edge connector of the main board, thereby allowing the board to exchange with each expansion card. Since the expansion card can transmit and receive an audio signal to and from expansion cards, engaging an expansion edge additionally formed in the audio card with an expansion edge connector in the main board avoids use of an expansion connector and a cable, saves money, reduces working procedures, and shields the electromagnetic interference produced by a cable.

16 Claims, 6 Drawing Sheets

COMPUTER SYSTEM USING A CARD HAVING AN EXPANSION EDGE

CLAIM OF PRIORITY

This application makes reference to, incorporates the same herein, and claims all benefits accruing under 35 U.S.C. §119 from an application for CARD HAVING AN EXPANSION EDGE earlier filed in the Korean Industrial Property Office on the 7th of May 1997 and there duly assigned Ser. No. 17486/1997.

BACKGROUND OF THE INVENTION

1. Technical Field

The present invention relates to a computer system using a card having an expansion edge generally, and more particularly to an audio card having an expansion edge that enables audio signals to be transmitted and received between the audio card and expansion cards. An expansion edge additionally formed in the audio card engages with an expansion edge connector in a main board.

2. Related Art

"Expansion card" as used herein is intended to refer to an MPEC card, a TV tuner card, a modem card, and the like. Conventional expansion cards are integrated into a computer system by engaging an edge connector of a main board of the computer system with an edge of the expansion card, and by securing a bracket on the expansion card to the case of the system main frame by use of tightened screws. Where additional capabilities are desired, the expansion card can be provided with expansion connector by means of which additional expansion cards can be connected thereto by use of a cable.

However, the expansion card as thus described is inconvenient because it requires soldering of an expansion connector to the main board in order to establish an additional capability (such as a multimedia capability). In addition, the use of such expansion cards makes it easy to make connection errors when engaging the expansion card with an additional card due to the similarity in appearance of the connectors. Furthermore, substantial electromagnetic interference results from the use of cables for interconnecting expansion cards.

Therefore, there is a need in the prior art for the development of an expansion card which is not burdened by the disadvantages discussed above.

The following patents are considered to be representative of the prior art, and are burdened by the disadvantages set forth herein: U.S. Pat. No. 5,715,146 to Hoppal, entitled Computer I/O Expansion Board Securing Apparatus And Method, U.S. Pat. No. 5,642,259 to Ma, entitled Arrangement For Connecting An Expansion Card To A Connector Socket IN A Personal Computer, U.S. Pat. No. 5,403,208 to Felcman et al., entitled Extended Card Edge Connector And Socket, U.S. Pat. No. 5,317,483 to Swindler, entitled Computer Expansion Card Support Structure, U.S. Pat. No. 4,996,766 to Piorunneck et al., entitled Bi-Level Card Edge Connector And Method Of Making The Same, and U.S. Pat. No. 5,434,743 to Hosoya et al., entitled Electronic Apparatus System Having An Electronic Apparatus Unit And An Expansion Unit For Expanding The Function Of The Electronic Apparatus Unit By Connection To An Expansion Card Connector.

SUMMARY OF THE INVENTION

Therefore, it is an object of the present invention to provide an improved computer system.

It is anther object to provide a computer system equipped with an improved expansion board assembly.

It is yet another object to provide an audio card which enables the audio card to transmit and receive an audio signal from an expansion card by coupling an expansion edge additionally formed on the audio card with an expansion edge connector additionally provided on the main board.

It is still another object to provide a computer system using a card with an expansion edge additionally formed along the side of a board adjacent to the edge.

To achieve the above-identified object, the present invention may be practiced with a board wherein an edge supporting a special bus is constructed in one body, a plurality of electrical fixtures are equipped for the control of the input/output of the signal, a bracket attaches the board to the system main frame with the tightening of a single screw, and one or more expansion connectors are attached to the board and are engaged with an expansion card by a cable. The latter arrangement allows the board to interface with each expansion card. Additionally, an expansion edge formed on the bottom case of the board, and connected to one or more expansion connectors by a pattern, mates with an expansion edge connector of the main board, and thereby allows the board to interface with each expansion card.

BRIEF DESCRIPTION OF THE DRAWING

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

Figure 5:
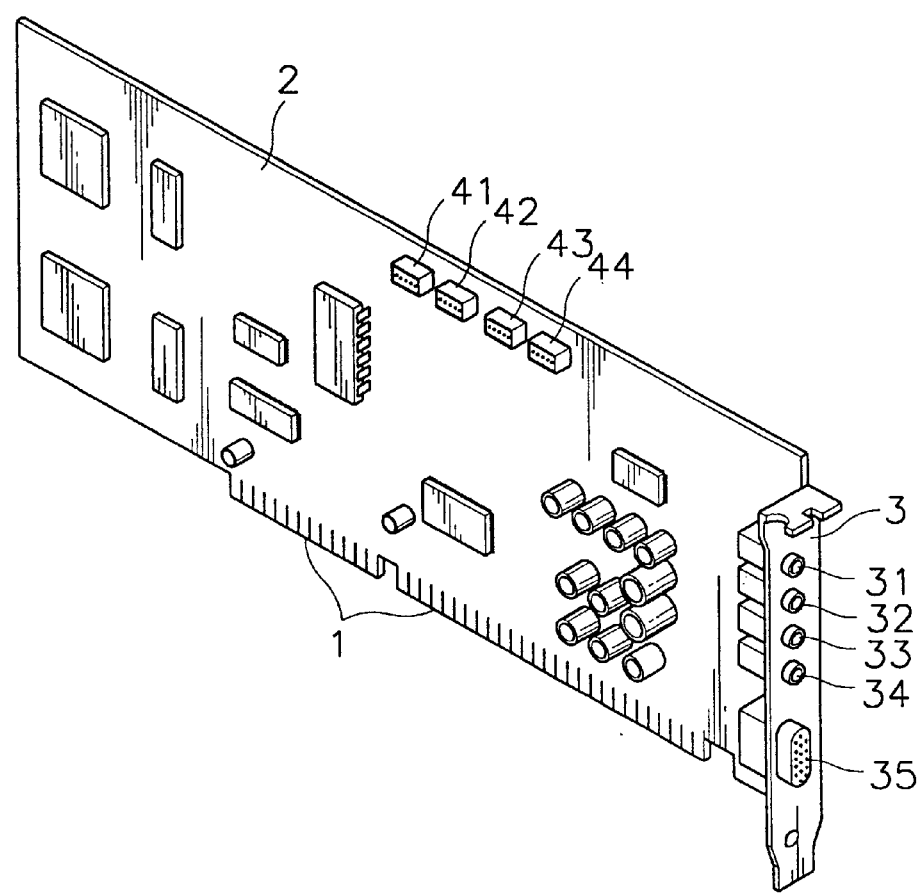
FIG. 5 shows an earlier version of an audio card.
Figure 6:
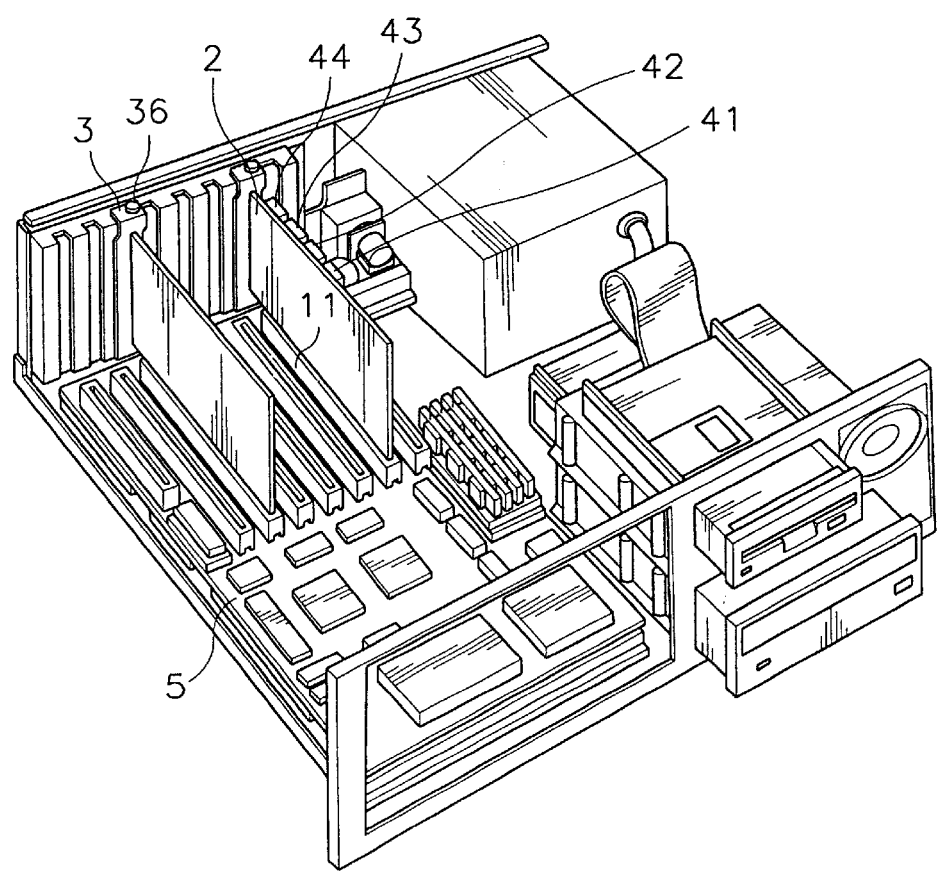
FIG. 6 shows an earlier version of an audio card engaged to a main frame of a computer system.
Figure 7:
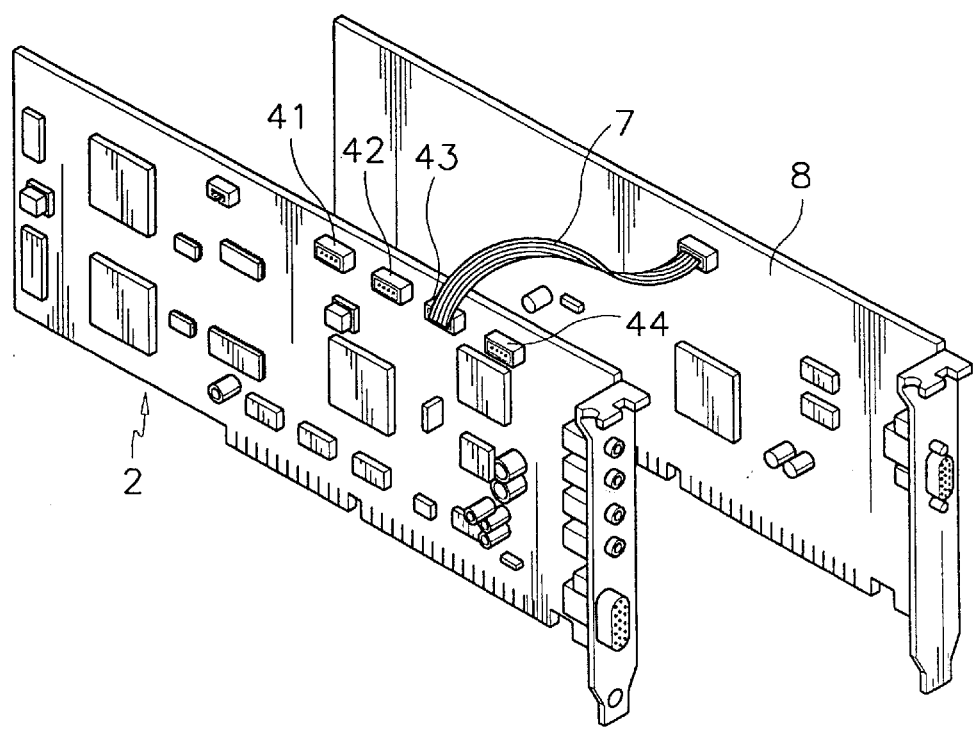
FIG. 7 shows connection of an earlier version of an audio card and an expansion card.

Turning first to FIGS. 5, 6 and 7, FIG. 5 shows an audio card which comprises: an edge 1 which supports a 16-bit ISA bus method; an audio board 2 equipped with electrical devices for controlling input/output of audio signals and for recording and replaying the audio signals; a bracket 3 located on an edge of the audio board 2, the bracket 3 having a plurality of external input/output terminals 31–35 and securely attaching the audio board 2 to a system main frame by tightening screws; and expansion connectors 41–44 mounted on the audio board 2 and connected to an expansion card by a cable, thereby enabling the audio board 2 to exchange audio signals with each expansion card.

As shown in FIG. 6, the audio card is integrated to a computer system by engaging an edge connector used in 16 bit ISA with an edge 1 of the audio board 2 used in 16 bit ISA, and by securing the bracket 3 to the bottom case of the system main frame by tightening screws (not shown).

If a multimedia environment is desired, as shown in FIG. 7, an expansion card 8 is attached to an expansion connector 43 of the audio board 2 with a cable 7. Thus, a cable 7 may be used to connect an expansion card 8 and an audio card 2 engaged in the main board, as shown in FIG. 7.

The audio card thus described is inconvenient because it requires the soldering of an expansion connector to the main board in order to establish a multimedia environment, because it is easy to make connection errors when engaging an expansion card with an audio card because of similarity in appearance of the connectors, and because substantial electro-magnetic interference results from the use of such cables.

Figure 1:
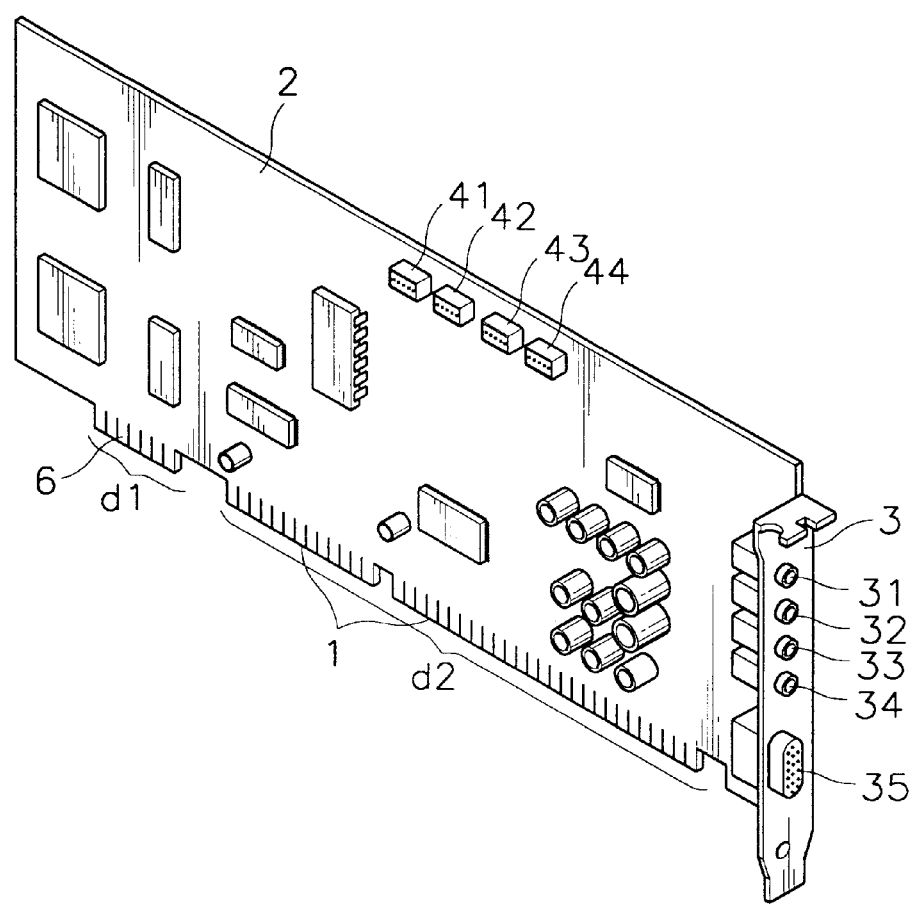
FIG. 1 shows an audio card constructed according to the principles of the present invention as an exemplary embodiment of the present invention.

With reference to the accompanying drawings, a card having an expansion edge constructed according to the principles of the present invention is described now. Turning to FIG. 1, a card is illustrated with an expansion edge according to an embodiment of the present invention, and includes audio board 2 equipped with electrical devices for controlling input/output of audio signals, and for recording and replaying the audio signals. The audio board 2 has the following components: an edge 1 which supports the 16 bit ISA method provided thereto; a bracket 3 located on an edge of the audio board 2, the bracket 3 having a plurality of external input/output terminals 31 to 35 and securely attaching the audio board 2 to the system main frame by tightening screws; expansion connectors 41–44 mounted on the audio board 2 and connected to an expansion card by a cable (not shown in FIG. 1, but similar to cable 7 in FIG. 7), thereby enabling the audio board 2 to exchange the audio signals with each expansion card; and an expansion edge 6 additionally formed on the bottom case of the board 2, connected to one or more expansion connectors 41–44 by a wiring pattern, and mated with an expansion edge connector of the main board, thereby allowing the board to interface with each expansion card.

A line-in terminal 31, a line-out terminal 32, a speaker terminal 33, a mike terminal 34 and a joystic/MIDI input terminal 35 are included in the plurality of external I/O terminals attached to the bracket 3.

The expansion connectors 41–44 include a first connector 41 for receiving audio signals from an MPEC card, a second connector 42 for receiving audio signals output from a TV tuner card, a third connector 43 for receiving audio signals output from a CD-ROM drive, and a fourth connector 44 for transmitting and receiving audio signals with a modem card.

Figure 2:
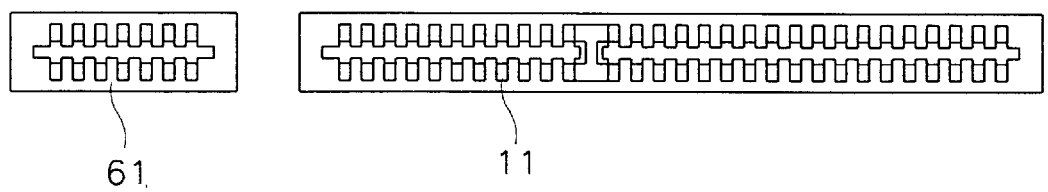
FIG. 2 shows an expansion edge connector and an edge connector of a main board engaged with an audio card according to the principles of the present invention.

FIG. 2 shows an edge connector 11 using the 16 bit ISA bus method and provided on the main board 5, and an expansion edge connector 61. An edge 1 of the audio board 2 is attached to the edge connector 11 of the main board 5. The expansion edge 6 of audio board 2 is mated with the expansion edge connector 61 additionally formed on the main board 5.

Figure 3:
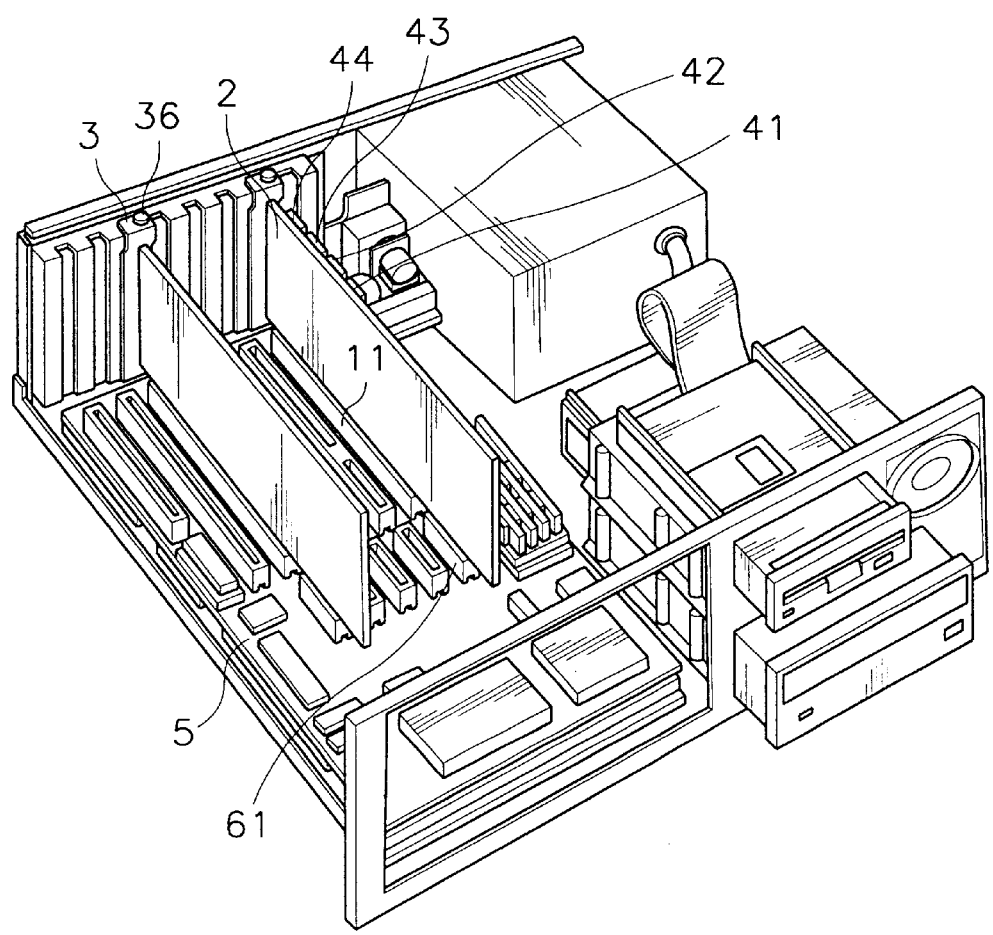
FIG. 3 shows the interior of a main frame of a computer system engaged with an audio card constructed according to the principles of the present invention.

FIG. 3 is an internal view of the system main frame, illustrating that the edge 1 of the audio board 2 and the expansion edge 6 are engaged with the edge connector 11 of the main board 5 and the expansion edge connector 61, respectively. By tightening the bracket 3 with screws (not shown), integration of the audio card into the computer system is achieved.

The expansion edge connector 61 of the main board 5 is connected to an expansion card by a wiring pattern.

Figure 4:
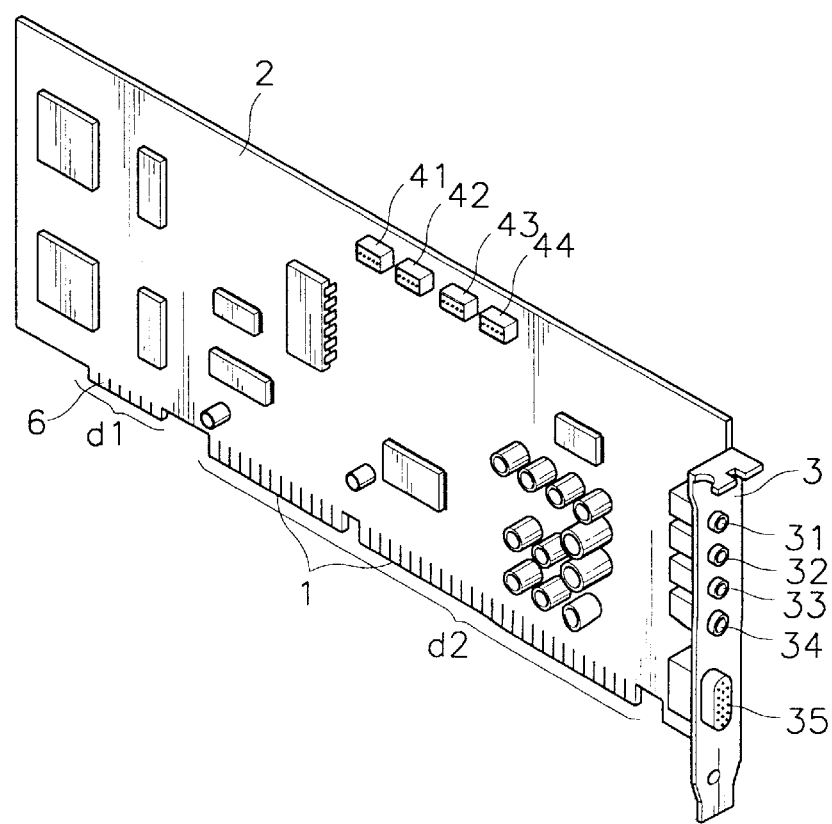
FIG. 4 shows an audio card constructed as another embodiment of the present invention.

Thereby, once the integration of an audio card is finished, the audio board 2 is able to transmit and receive an audio signal from an expansion card through the expansion edge 6 and the expansion edge connector 61, and without using the expansion connectors 41–44. In the case where an expansion edge connector 61 is not provided in the main board, an audio card having an expansion edge 6 as shown in FIG. 4 can still be used. In an audio card having an expansion edge as shown in FIG. 4, the length or protrusion distance d2 of expansion edge 6 is shorter than the length or protrusion distance d1 of an edge 1 using the 16 bit ISA bus method. Therefore, although other electrical devices are attached to the main board 5 in place of the expansion edge connector 61, the edge 1 of the audio board 2 is engaged with the edge connector 11 of the main board 5. Thereby, if the audio card 2 is mounted on the main board 5, integration is achieved by securely attaching the bracket 3 to the system main frame with screws (not shown).

Once integration of the audio card is achieved, the first to fourth connectors 41~44 are connected to an expansion card. Thus, the audio board 2 can transmit and receive an audio signal from an expansion card by means of a cable. For the purpose of making the present invention, the audio board 2 is not limited to the 16 bit ISA method. Thus, in accordance with the invention, a card can transmit and receive an audio signal with an expansion card by engaging an expansion edge additionally formed in the audio card with an expansion edge connector in the main board. This avoids use of an expansion connector and a cable. Thus, it is possible to save money, to reduce working procedures, and to avoid the electromagnetic interference produced by a cable.

It should be understood that the present invention is not limited to the particular embodiment disclosed herein as the best mode contemplated for carrying out the present invention, but rather that the present invention is not limited to the specific embodiments described in this specification except as defined in the appended claims.

What is claimed is:

1. A computer system, comprising:

a frame;

a main board mounted on said frame, said main board having a bus connector and an expansion connector;

a board having an edge supporting a special bus method for controlling input/output of a signal, said edge supporting said special bus method being connected to said bus connector;

fixing means for securely attaching the board to the frame of said computer system, said fixing means being provided on the edge of the board and having a plurality of input/output terminals;

expansion connector means connected to an expansion card via a cable and to the board for transmitting signals to and receiving signals from the expansion card; and an expansion edge additionally formed on an edge of the board and connected to said expansion connector means, said expansion edge being mated with an expansion edge connector of the main board while allowing the main board to exchange signals with the expansion card.

2. A computer system according to claim 1, wherein a first protrusion distance of the expansion edge is shorter than a second protrusion distance of said edge supporting the a special bus method.

3. A computer system according to claim 1, wherein said expansion connector means comprises at least one expansion connector.

4. A computer system according to claim 3, wherein said expansion connector means comprises a plurality of expansion connectors.

5. A computer system according to claim 1, wherein said fixing means comprises a bracket for use with a plurality of screws.

6. A computer system according to claim 1, wherein said expansion edge is connected to said expansion connector means by a wiring pattern.

7. An expansion card for use in a computer system and mountable therein, said expansion card comprising:
- a main portion comprising a board having at least two edges;
- fixing means provided on one of said at least two edges of said board for securely attaching the board to a main frame of the computer system;
- connector means located on another of said at least two edges for electrically connecting said board to said computer system;
- an expansion edge additionally formed on said another of said at least two edges for mating with an expansion edge connector of a main board of said computer system;
- expansion connector means mounted on said board for interconnecting said board with at least one other expansion card; and
- wiring means provided on said board for interconnecting said expansion edge and said expansion connector means, and allowing said main board of said computer system to exchange signals with said at least one other expansion card.

8. An expansion card according to claim 7, wherein said wiring means comprises a wiring pattern.

9. An expansion card according to claim 7, wherein a first protrusion distance of said expansion edge is shorter than a second protrusion distance of the edge supporting said special bus method.

10. An expansion card according to claim 9, wherein said fixing means is provided on one of said at least two edges of said board.

11. An expansion card according to claim 10, wherein said fixing means comprises a bracket for use with a plurality of screws.

12. An expansion card according to claim 7, wherein said expansion connector means comprises at least one expansion connector connected to said at least one other expansion card by a cable.

13. A computer system, comprising:
- a board having an edge provided with electrical connector means for electrically connecting said board to a main board of said computer system;
- fixing means for securely attaching said board to a frame of said computer system;
- expansion connector means mounted on said board and connected to at least one expansion card via at least one cable; and
- an expansion edge additionally formed on another edge of said board and connected to said expansion connector means, wherein said expansion edge mates with an expansion edge connector on said main board of said computer system, thereby allowing the main board to exchange signals with said at least one expansion card.

14. A computer system according to claim 13, wherein a first protrusion distance of the expansion edge is shorter than a second protrusion distance of the edge provided with electrical connector means.

15. A computer system according to claim 13, wherein said fixing means comprises a bracket for use with a plurality of screws.

16. A computer system according to claim 13, further comprising terminal means disposed on another edge of said board for serving as at least one of an input terminal and an output terminal of said board.

* * * * *